(12) United States Patent
Knapton

(10) Patent No.: US 6,268,734 B1
(45) Date of Patent: Jul. 31, 2001

(54) OPERATIONAL AMPLIFIER INPUT OFFSET VOLTAGE AND INPUT BIAS CURRENT TEST CIRCUIT

(75) Inventor: James H. Knapton, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/523,116

(22) Filed: Mar. 10, 2000

(51) Int. Cl.[7] .................. H01H 31/02; G01R 19/00; G01R 23/00; H03F 3/45
(52) U.S. Cl. ................... 324/537; 330/2; 330/69; 330/260
(58) Field of Search .................. 324/537; 330/2, 330/69, 260

(56) References Cited

U.S. PATENT DOCUMENTS

| | | | |
|---|---|---|---|
| 3,783,372 | * | 1/1974 | Boyd ........................ 324/537 |
| 5,103,122 | * | 4/1992 | O'leary et al. ............... 327/307 |
| 5,202,613 | * | 4/1993 | Kruse ........................ 318/254 |
| 5,327,029 | * | 7/1994 | Ericson et al. ............... 327/350 |
| 5,386,160 | * | 1/1995 | Archer et al. ............... 327/513 |
| 5,592,124 | * | 1/1997 | Mullins et al. .............. 330/308 |
| 5,744,965 | * | 4/1998 | Miller et al. ................ 324/538 |
| 6,081,106 | * | 8/1998 | Camerlo ..................... 323/280 |

* cited by examiner

Primary Examiner—Glenn W. Brown
Assistant Examiner—Wasseem H. Hamdan
(74) Attorney, Agent, or Firm—Koppel & Jacobs

(57) ABSTRACT

A precision op amp test circuit employs latching relays, the contacts of which are latched open or closed as necessary to make test measurements. The relays' metal contacts ensure low resistance conductive paths, and because the coil of a latching relay need be energized only briefly to latch the contacts, the heating duty cycle of the coils can be kept low to substantially eliminate the accuracy-degrading thermal E.M.F. generated by the heat from the energized coil of a conventional relay. The test circuit is advantageously used for testing both VOS and IB for high precision, low-VOS op amps.

14 Claims, 2 Drawing Sheets

OPERATIONAL AMPLIFIER INPUT OFFSET VOLTAGE AND INPUT BIAS CURRENT TEST CIRCUIT

BACKGROUND OF THE INVENTION

1. Field of the Invention

This invention relates to the field of operational amplifier test circuits, and particularly to test circuits which determine an op amp's input offset voltage (VOS) and input bias current (IB).

2. Description of the Related Art

The parameters of an operational amplifier (op amp) are typically established by means of a test circuit which applies known inputs to the op amp's inverting and non-inverting inputs and monitors its output. For example, input offset voltage (VOS), i.e., the voltage that results in an output of zero when applied to both op amp inputs, is typically determined by connecting the inverting and non-inverting inputs of the device under test (DUT) to ground via respective resistors, and connecting a feedback resistor between the DUT's output and its inverting input. The input and feedback resistors are generally selected to establish a high gain around the DUT. VOS for the DUT is determined by measuring its output voltage under these conditions, and dividing the measured voltage by the gain value.

Another frequently tested op amp parameter is input bias current (IB), i.e., the current which flows into each of the DUT's inputs when it is operating. This can be determined in any of several ways. For example, a current meter may be connected in series with each of the DUT's inputs and IB measured directly. Alternatively, IB can be determined by measuring the voltage across a pair of input resistors with a very sensitive voltmeter.

Many op amps must be tested for both VOS and IB. When this is the case, IB can be determined by measuring VOS as described above, and then inserting an additional resistance in series with one of the DUT's inputs and measuring VOS again. The difference between the two VOS readings is divided by the additional resistance to give IB.

Virtually all of these test strategies require the use of some sort of switching circuitry, to manipulate the test conditions and to make appropriate measurements as necessary. For example, when IB is measured by comparing VOS measurements with and without the presence of an additional input resistance, a switching means must be used to insert the resistance into and remove it from the circuit. Semiconductor switches can be used for this purpose, but doing so tends to degrade the accuracy of the testing, due to the inherent resistance of such a switch, together with the time required to fully turn on or off, and their leakage current in the off condition. While this may not be a problem for general purpose op amps, it is unacceptable when testing precision op amps, which can have VOS and IB specifications of less than 10 $\mu$V and 1 nA, respectively.

Conventional electromagnetic relays are often employed as a switching means for testing precision op amps, due to the very low resistance conductive path provided when their contacts are closed. However, when the electromagnetic coil of a conventional relay is energized for a length of time, heat from the coil generates a thermal E.M.F. in series with the relay contacts. This thermal voltage represents an error that gets added directly to the DUT's VOS measurement, degrading the accuracy of both VOS and IB measurements. When very low VOS and/or IB values must be measured, the error due to thermal E.M.F. can be unacceptably high.

SUMMARY OF THE INVENTION

An op amp test circuit is presented which overcomes the difficulties noted above. The invention avoids the testing inaccuracies introduced by conventional switching means, thus enabling highly accurate testing of precision op amps.

The invention requires that the switching means for a DUT test circuit comprise latching relays, the contacts of which are latched open or closed as necessary, preferably prior to making test measurements. The use of metal relay contacts ensures the provision of a conductive path with near-zero resistance when the contacts are closed. In addition, the electromagnetic coil of a latching relay need be energized only briefly to latch the contacts in a desired position, after which power to the coil can be removed. By removing power to the relay coil except when changing its state, the heating duty cycle is kept low, and the accuracy-degrading thermal E.M.F. present in the prior art is virtually eliminated.

The novel test circuit is advantageously used for testing both VOS and IB for high precision, low-VOS op amps. In a preferred embodiment, first and second resistances are connected in series with an op amp's inverting and non-inverting inputs, respectively, with a set of latching relay contacts connected across each resistance. Additional resistors around the DUT provide a high loop gain value. The coils controlling each set of contacts are briefly energized to latch the contacts closed, thereby keeping thermal E.M.F. negligible. With the input resistances bypassed by the closed contacts, the DUT's VOS is determined. One set of contacts is then opened (by briefly energizing the appropriate latching relay coil), inserting its corresponding resistance into the DUT's input circuit and causing VOS to change. The difference between the two VOS values is proportional to the IB value for the corresponding input.

Further features and advantages of the invention will be apparent to those skilled in the art from the following detailed description, taken together with the accompanying drawings.

DETAILED DESCRIPTION OF THE INVENTION

Figure 1:
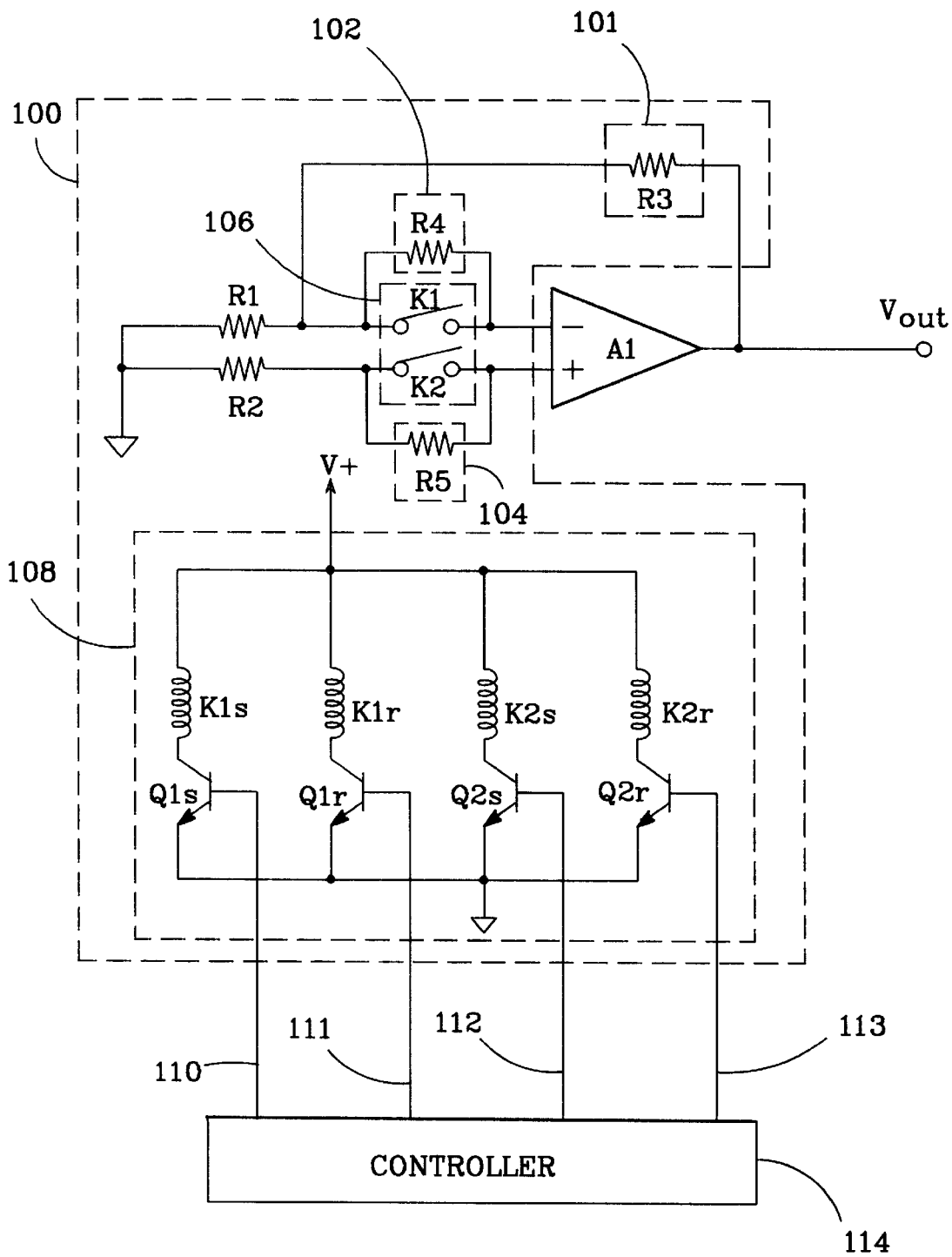
FIG. 1 is a schematic diagram of an op amp test circuit illustrating the principles of the invention.

A test circuit 100 in accordance with the present invention is shown in FIG. 1. An op amp A1 is the DUT. Test circuit 100 is connected around A1, with a resistance R1 connected between A1's inverting input and a ground point, a resistance R2 connected between A1's non-inverting input and the ground point, and a feedback circuit 101, here a simple resistor R3, connected between the output of A1 and its inverting input (via a switching means 106 or a current measuring means 102, discussed below). R3 and R1 establish a loop gain of (R3/R1)+1 around A1, and R2 is present to balance the inputs.

When configured as shown in FIG. 1, the VOS of A1 is determined by measuring the output voltage $V_{out}$ produced by A1 with switching means 106 closed (discussed below) and dividing by the gain value, as follows:

$$VOS = V_{out}/((R3/R1)+1)$$

Test circuit 100 can also be used to determined IB for each of A1's inputs. As shown in FIG. 1, a current measuring means 102 is connected between RI and A1's inverting input, and a current measuring means 104 is connected between R2 and A1's non-inverting input. A "current measuring means" as used herein can consist of any number of possible circuits, such as a very sensitive ammeter, or a resistor having a sensitive voltmeter connected across it. The currents measured by current measuring means 102 and 104 are the IB values for A1's inverting and non-inverting inputs, respectively.

To prevent current measuring means 102 and 104 from degrading the accuracy of the VOS measurement, a switching means 106 is connected across current measuring means 102 and 104 which enables them to be bypassed and thus eliminated from the test circuit. Per the present invention, switching means 106 comprises sets of latching relay contacts K1 and K2, which are connected across current measuring means 102 and 104, respectively: when closed, latching contacts K1 provide a low resistance conductive path around means 102, while latching contacts K2 do the same for means 104. As used herein, a "set" of latching relay contacts refers to a pair of terminals that are shorted together when the contacts are "closed", and "latching contacts K1 open (or closed)" is the same as latching the set of contacts K1 open (or closed). To operate latching relay contacts K1 and K2, test circuit 100 must also include electrical operating means 108 (described in more detail below), which enable contacts K1 and K2 to be latched open or closed as needed using respective control signals 110, 111, 112 and 113.

To operate latching relay contacts K1, electrical operating means 108 includes "set" and "reset" latching relay coils K1s and K1r, which, when energized, latch relay contacts K1 closed or open in accordance with control signals 110 and 111, respectively. Similarly, means 108 includes latching relay coils K2s and K2r, for latching relay contacts K2 into a desired position. Because the contacts are those of a latching relay, they remain in the desired position after their corresponding coil is de-energized.

The use of latching relays provides a number of advantages, particular when testing op amps having low VOS and IB specifications as discussed above. Because they are metal relay contacts, the resistance of the conductive path provided by the contacts is very low. In addition, because the relays are latching relays, thermal E.M.F. that could otherwise degrade the accuracy of the test measurements can be virtually eliminated. Thermal E.M.F. arises in a relay when an energized coil generates heat sufficient to cause a voltage to appear in series with the relay's contacts. This is a slow phenomenon, typically having a time constant of a minute or more. This can become a problem when conventional relays are employed, as their coils must be continuously energized to hold the contacts in one of their two possible positions.

However, when latching relays are used, the coils need be energized only briefly to move the contacts into either the open or closed position; typical latching relay coils need only be energized for several milliseconds to latch their contacts open or closed. As a result, the coils' heating duty cycle can be kept low, so that the amount of heat generated is negligible. This virtually eliminates the thermal E.M.F. that would otherwise be in series with the relay contacts and which introduces error into the VOS measurement. Though thermal E.M.F.-induced error is small, it is significant when attempting to measure very low VOS and/or IB values; thus, its elimination is very advantageous when testing high performance precision op amps. A controller 114 arranged to keep the heating duty cycles low is typically employed to provide control signals 110–113 to electrical operating means 108.

The key to the beneficial use of latching relays as described herein is keeping the coil heating duty cycle low enough to ensure that the thermal E.M.F. generated is negligible. When this is done, it is not essential that the coils be de-energized at the time test measurements are made. However, it is preferred that the coils be de-energized at the time test measurements are made, to eliminate any possible errors that might arise due to current flowing through the coils.

It should be noted that while one of the current measuring means described above may be suitable for testing a general purpose op amp, they may be unacceptable for use with op amps having very low VOS and/or IB specifications. For example, some precision op amps have maximum VOS specifications of 1 $\mu$V or less, and maximum IB specifications on the order of 50 picoamps. Ammeters and/or voltmeters capable of measuring these very low values may be prohibitively expensive. Instrumentation amplifiers might also be employed which sense the voltage across an input resistor to measure IB, but such amplifiers can require frequent calibration and can themselves serve as a source of error.

The preferred method of measuring IB with test circuit 100 is to make current measuring means 102 and 104 resistors, such as R4 and R5 in FIG. 1, and to measure $V_{out}$ (and thus VOS) under two conditions: $V_{out}$ is first measured with latching relay contacts K1 and K2 both closed, which eliminates R4 and R5 from the circuit. The contacts for the DUT input to be tested are then opened, which inserts the corresponding resistor into the circuit. For example, if the IB of A1's inverting input is to be determined, contacts K1 are opened and R4 thereby switched into the circuit. The additional resistance in series with the input being tested results in a change in $V_{out}$, which is again measured. The change in output voltage due to R4 is proportional to the current in R4, as follows:

$$IB_{inv.input} = (V_{out1} - V_{out2})/\text{loop gain}/R4$$

where $V_{out1}$ and $V_{out2}$ are the first and second $V_{out}$ measurements, respectively, and the loop gain is given by (R3/R1)+1.

The IB of the non-inverting input is determined similarly, by measuring $V_{out}$ both before and after resistor R5 is switched into the test loop via contacts K2. The IB value is then given by:

$$IB_{non-inv.input} = (V_{out1} - V_{out2})/\text{loop gain}/R5$$

If K1 and K2 were conventional relays and IB was determined in accordance with the preferred method, any difference in the relays' thermal E.M.F. contributions would induce an error in the VOS reading. Even if the thermal E.M.F. contributions cancel each other out during the first VOS measurement, the cancellation is not present when one of the contacts is opened, resulting in an error in the second VOS measurement.

These problems are avoided when latching relays are used. As long as the coils' heating duty cycle is kept low, virtually no thermal E.M.F. is generated and thus the VOS measurements do not suffer from this error source.

One possible embodiment of electrical operating means 108 is shown in FIG. 1. A pair of npn transistors Q1s and Q1r are connected between a ground and coils K1s and K1r, respectively, the other ends of which are connected to a supply voltage V+. Control signals 110 and 111 are connected to the bases of Q1s and Q1r, respectively, and contacts K1 are latched open or closed as needed by properly manipulating signals 110 and 111. Similarly, a pair of transistors Q2s and Q2r drive coils K2s and K2r in accordance with control signals 112 and 113, respectively. Controller 114 is preferably arranged to provide control signals 110–113 that energize the appropriate drive coils just long enough to latch the relays contacts into the positions needed to perform a test, thereby keeping the coils' heating duty cycles low.

Figure 2:
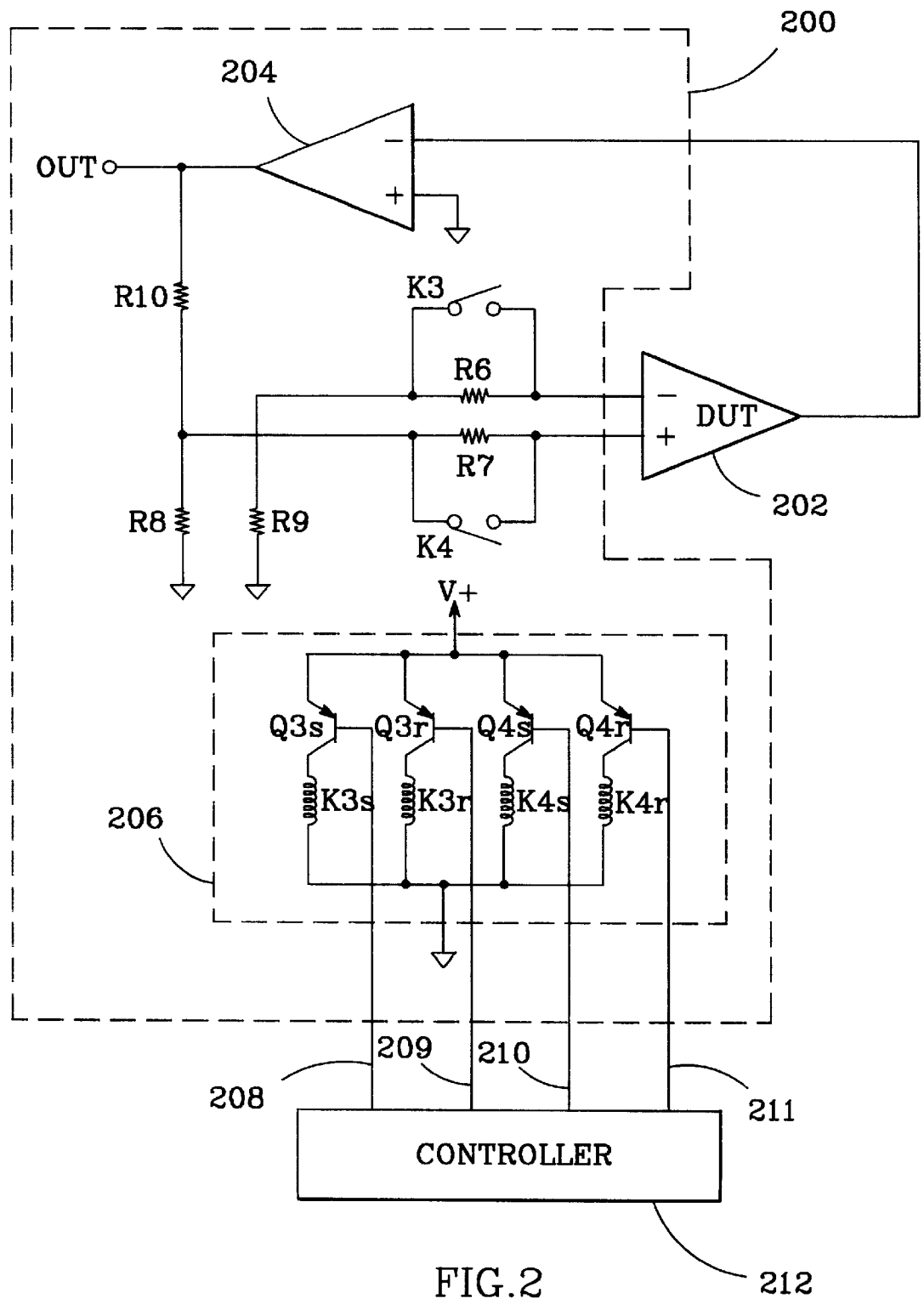
FIG. 2 is a schematic diagram of a preferred embodiment of a VOS and IB test loop per the present invention.

A preferred VOS and IB test loop 200 is shown in FIG. 2. An op amp 202 is the DUT. Test loop 200 includes a pair of resistors R6 and R7 connected to the inverting and non-inverting inputs of DUT 200, respectively, and another pair of resistors R8 and R9 connected between R6 and R7, respectively, and ground. The inverting input of a second amplifier 204 (commonly referred to as a null amplifier) receives the output of DUT 202, with the output of amplifier 204 connected back to the non-inverting side of DUT 202 via a feedback resistor R10. Two sets of latching relay contacts K3 and K4 are connected across resistors R6 and R7, respectively, and an electrical operating means 206 controls the position of contacts K3 and K4 in accordance with control signals 208, 209, 210 and 211.

The gain of the test loop is established by resistors R10 and R8, and is given by (R10/R8)+1. Because the IB of the non-inverting input flows through R8, R8's presence introduces a small error into the VOS measurement. This is compensated for with resistor R9, which is selected to balance the DUT's inputs.

The VOS of DUT 202 is determined by 1)latching relay contacts K3 and K4 closed to remove resistors R6 and R7 from the test loop using a short duty cycle, 2)preferably de-energizing the relay coils corresponding to contacts K3 and K4, 3)measuring the output OUT of second amplifier 204, and 4)dividing OUT by the loop gain; the result is the VOS of DUT 202. Operating latching relays K3 and K4 with a short duty cycle virtually eliminates the thermal E.M.F.-induced error that would be present with conventional relays, allowing very precise and accurate measurements of VOS to be made.

An IB value for the inverting input of DUT 202 is determined by 1)measuring OUT with K3 and K4 latched closed (using short duty cycles), 2)latching contacts K3 open (using a short duty cycle), thereby inserting resistor R6 into the test loop, 3)preferably de-energizing the relay coil corresponding to contacts K3, 4)again measuring OUT, and 5)calculating IB for the inverting input in accordance with:

$$IB=(OUT1-OUT2)/\text{loop gain}/R6,$$

where OUT1 and OUT2 are the first and second OUT measurements, respectively, the loop gain is given by (R10/R8)+1, and R6 is the resistance of resistor R6.

The IB of the non-inverting input is determined in the same way, except that contacts K4 are latched open with contacts K3 latched closed, so that resistor R7 is inserted into the test loop while resistor R6 is bypassed. For this input, IB is given by:

$$IB=(OUT1-OUT2)/\text{loop gain}/R7$$

The test loop's gain should be selected based on the expected value of VOS. A very high gain, e.g., 10,000, should be employed when testing precision op amps having VOS specifications of less than 10 $\mu$V. The feedback path can connect to either side of DUT 202; however, connection to the non-inverting side as shown in FIG. 2 is preferred, as this arrangement tends to be more stable. If the feedback path connects to the inverting side of DUT 202, the inputs to second amplifier 204 must be reversed.

When selecting the test loop's resistor values, consideration should be given to the application for which the DUT is designed. For example, IB is preferably measured under conditions similar to those most likely to be encountered in a user's application. The desired gain and the input voltage range of the second amplifier should also be considered. For an op amp designed to provide a VOS of less than 10 $\mu$V, R10 and R8 might be 500 k$\Omega$ and 50$\Omega$, respectively, to provide a gain of 10,001. To balance the DUT's inputs, R9 should also be 50$\Omega$. R6 and R7 should be selected to cause a clearly measurable change in VOS to occur upon the opening of contacts K3 or K4; R6 and R7 values of about 332 k$\Omega$ would suffice with a loop gain of 10,001 and an expected IB value of less than 50 pA.

Electrical operating means 206 are similar to those shown in FIG. 1, with set and reset coils K3s and K3r controlling the position of contacts K3, and coils K4s and K4r controlling the position of contacts K4. The coils are energized with pnp transistors Q3s, Q3r, Q4s and Q4r, which are switched on and off with control signals 208, 209, 210 and 211, respectively. A controller 212 arranged to keep the heating duty cycles low typically provides control signals 208–211. The operating means configuration shown in FIG. 2 is preferred over that shown in FIG. 1, because no voltage is on the coils when they are de-energized.

Note that electrical operating means circuits 108 and 206 depicted in FIGS. 1 and 2 are merely exemplary, and that many other possible operating means implementations are possible. For example, n-channel MOSFETs could be employed in place of Q1s, Q1r, Q2s and Q2r, and p-channel MOSFETs could be used in place of Q3s, Q3r, Q3s and Q3r. It is only essential that the operating means provide a way of latching the test circuit's relay contacts into a desired position in which they remain after the operating means is de-energized.

The test loop shown in FIG. 2 is preferred because it enables the accurate measurement of a precision op amp's VOS and IB without requiring highly sensitive instrumentation or complex test setups. Latching relays are readily available, from Omron Corporation of Schaumberg, Ill., for example. Additional features can easily be added to the test loop which would, for example, enable the DUT's supply voltage to be varied or allow other voltages to be summed with the feedback voltage as needed.

While particular embodiments of the invention have been shown and described, numerous variations and alternate embodiments will occur to those skilled in the art. Accordingly, it is intended that the invention be limited only in terms of the appended claims.

I claim:

1. An operational amplifier test circuit, comprising:
    an operational amplifier (op amp) having an input offset voltage (VOS), inverting and non-inverting inputs having respective input bias (IB) currents, and an output,
    a first resistance connected between said inverting input and a ground point,
    a second resistance connected between said non-inverting input and said ground point,
    a feedback circuit connected between said output and one of said inputs which establishes a gain value for said test circuit such that the VOS of said op amp is equal to said op amp's output divided by said gain value,
    at least one current measuring means switchably inserted into said test circuit between said first resistance and said inverting input or between said second resistance and said non-inverting input, at least one set of latching relay contacts connected across a respective one of said current measuring means which when closed provides a low resistance path around its respective current measuring means to enable said op amp's VOS to be measured and when open inserts said current measuring means into said test circuit to enable the IS of the op amp input to which it is connected to be determined, and electrical operating means for operating said at least one set of latching relay contacts in response to a set of control signals, said operating means comprising electromagnetic coils to latch said sets of latching relay contacts open and closed, said coils becoming heated when operated, said latching relay contacts and electrical operating means enabling the use of a short duty cycle to operate said coils such that thermal electromotive force (E.M.F.) that would otherwise be in series with said sets of contacts due to the heating of said coils is substantially eliminated.

2. The test circuit of claim 1, wherein said first and second resistances are substantially equal.

3. The test circuit of claim 1, wherein each of said current measuring means comprises a resistor.

4. The test circuit of claim 1, wherein said at least one current measuring means comprises third and fourth resistors, said third resistor connected between said first resistance and said inverting input and said fourth resistor connected between said second resistance and said inverting input, and said at least one set of latching relay contacts comprises first and second sets of latching relay contacts connected across said third resistor and said fourth resistor, respectively.

5. The test circuit of claim 1, wherein said feedback circuit comprises a resistor.

6. The test circuit of claim 1, wherein said feedback circuit comprises a second amplifier and a feedback resistor connected in series.

7. The test circuit of claim 1, wherein said electrical operating means comprises two electromagnetic coils for each set of said latching relay contacts.

8. The test circuit of claim 1, further comprising a controller which provides said set of control signals to said electrical operating means, said controller arranged to provide control signals which keep the heating duty cycles of said electromagnetic coils low enough to substantially eliminate thermal E.M.F. that would otherwise be in series with said sets of contacts due to the heating of said coils.

9. An operational amplifier test loop, comprising:

an operational amplifier (op amp) having an input offset voltage (VOS), inverting and non-inverting inputs and an output, a first resistance and a second resistance, said first resistance connected between said inverting input and one end of said second resistance, the other end of said second resistance connected to a ground point, a third resistance and a fourth resistance, said third resistance connected between said non-Inverting input and one end of said fourth resistance, the other end of said fourth resistance connected to said ground point, first and second sets of latching relay contacts connected across said first and third resistances, respectively, which when closed provide low resistance paths around their respective resistances and when open insert their respective resistances into said test loop, a second amplifier and a feedback resistor connected in series between said op amp output and at least one of said resistances which establishes a high loop gain for said test loop such that the VOS of said op amp is equal to the output of said second amplifier divided by said loop gain, electrical operating means for operating said first and second sets of latching relay contacts in response to a set of control signals, said operating means comprising electromagnetic coils to latch said sets of latching relay contacts open and closed, said coils becoming heated when operated, and a controller which provides said set of control signals to said electrical operating means, said controller arranged to provide control signals which keep the heating duty cycles of said electromagnetic coils low enough to substantially eliminate thermal electromotive force (E.M.F.) that would otherwise be in series with said sets of contacts due to the heating of said coils.

10. The test loop of claim 9, wherein said first and third resistances are substantially equal.

11. The test loop of claim 9, wherein said second and fourth resistances are substantially equal.

12. The test loop of claim 9, wherein said second amplifier, said feedback resistor, and said resistances are arranged such that said loop gain is equal to at least 1000.

13. The test loop of claim 9, wherein said electrical operating means comprises first and second electromagnetic coils for operating said first latching relay contacts and third and fourth electromagnetic coils for operating said latching relay contacts.

14. The test loop of claim 13, wherein said electrical operating means further comprises first, second, third and fourth pnp transistors, the current circuits of which are connected between respective ones of said coilsopposite said transistors connected to a ground point, said set of control signals being applied to the control inputs of said transistors, each of said transistors turned on with a respective one of said control signals to energize said transistor's respective coil.

* * * * *